US009018074B2

(12) United States Patent
Zhang et al.

(10) Patent No.: US 9,018,074 B2
(45) Date of Patent: Apr. 28, 2015

(54) PHOTONIC SEMICONDUCTOR DEVICES IN LLC ASSEMBLY WITH CONTROLLED MOLDING BOUNDARY AND METHOD FOR FORMING SAME

(71) Applicant: Excelitas Canada, Inc., Vaudreuil-Dorion (CA)

(72) Inventors: Xianzhu Zhang, Pointe-Claire (CA); Jerry Deleon, Calamba (PH); Arthur John Barlow, Alton (GB)

(73) Assignee: Excelitas Canada, Inc., Vaudreuil-Dorion (CA)

( * ) Notice: Subject to any disclaimer, the term of this patent is extended or adjusted under 35 U.S.C. 154(b) by 0 days.

(21) Appl. No.: 13/938,629

(22) Filed: Jul. 10, 2013

(65) Prior Publication Data
US 2014/0008778 A1 Jan. 9, 2014

Related U.S. Application Data

(63) Continuation-in-part of application No. 13/411,275, filed on Mar. 2, 2012, now Pat. No. 8,791,492, which is a continuation-in-part of application No. 12/572,074, filed on Oct. 1, 2009, now Pat. No. 8,431,951.

(51) Int. Cl.
*H01L 21/76* (2006.01)
*H01L 23/00* (2006.01)
H01L 33/48 (2010.01)
H01L 33/64 (2010.01)
H01S 5/022 (2006.01)
H01L 23/31 (2006.01)
H01L 21/56 (2006.01)

(52) U.S. Cl.
CPC .............. *H01L 24/50* (2013.01); *H01L 33/486* (2013.01); *H01L 33/64* (2013.01);
(Continued)

(58) Field of Classification Search
CPC ........... H01L 2924/01079; H01L 2924/01078; H01L 23/10
USPC .................. 438/456, 458; 257/433, E21.499, 257/E21.503
See application file for complete search history.

(56) References Cited

U.S. PATENT DOCUMENTS 5,035,483 A 7/1991 Waitl et al.
(Continued)

FOREIGN PATENT DOCUMENTS

EP 1876653 A2 1/2008
(Continued)

OTHER PUBLICATIONS

International Search Report and Written Opinion received for PCT Application No. PCT/GB2010/001825, mailed on Jan. 12, 2011, 12 pages.

*Primary Examiner* — Quoc Hoang
(74) *Attorney, Agent, or Firm* — Peter A. Nieves; Sheehan Phinney Bass + Green PA

(57) ABSTRACT

Embodiments of a laminate leadless carrier package are presented. The package includes an optoelectronic chip, a substrate supporting the optoelectronic chip, a plurality of conductive slotted vias, a wire bond pad disposed on the top surface of the substrate, a wire bond coupled to the optoelectronic chip and the wire bond pad and an encapsulation covering the optoelectronic chip, the wire bond, and at least a portion of the top surface of the substrate. The slotted vias provide electrical connections between the top conductive layer and the bottom conductive layer. The substrate includes a plurality of conductive and dielectric layers laminated together including a bottom conductive layer, a top conductive layer, and a dielectric layer between the top and bottom conductive layers. The encapsulation is a molding compound, and the molding compound is pulled back from at least one of the slotted vias.

21 Claims, 12 Drawing Sheets

(52) U.S. Cl.
CPC ......... *H01S 5/02228* (2013.01); *H01S 5/02236* (2013.01); *H01S 5/02252* (2013.01); H01S 5/02276 (2013.01); *H01L 2224/48091* (2013.01); *H01L 2224/73265* (2013.01); *H01L 2924/3011* (2013.01); H01L 24/97 (2013.01); *H01L 24/32* (2013.01); *H01L 24/45* (2013.01); *H01L 24/48* (2013.01); *H01L 2224/32225* (2013.01); *H01L 2224/45015* (2013.01); *H01L 2224/45124* (2013.01); *H01L 2224/45144* (2013.01); *H01L 2224/48227* (2013.01); *H01L 2224/48465* (2013.01); *H01L 2224/48472* (2013.01); *H01L 2924/00014* (2013.01); *H01L 23/3121* (2013.01); *H01L 21/56* (2013.01); *H01L 2224/97* (2013.01); *H01L 2924/12041* (2013.01); *H01L 2924/1461* (2013.01)

(56) References Cited

U.S. PATENT DOCUMENTS

| | | |
|---|---|---|
| 5,627,851 A | 5/1997 | Takahashi |
| 6,571,466 B1 | 6/2003 | Glenn et al. |
| 6,753,600 B1 | 6/2004 | Ho |
| 7,741,194 B2 * | 6/2010 | Griffiths .................. 438/458 |
| 8,431,951 B2 | 4/2013 | Zhang |
| 2004/0233950 A1 | 11/2004 | Furukawa |
| 2005/0248008 A1 | 11/2005 | Wilson et al. |
| 2008/0006837 A1 | 1/2008 | Park et al. |
| 2009/0230420 A1 | 9/2009 | Bogner et al. |
| 2011/0079801 A1 | 4/2011 | Zhang |
| 2012/0213239 A1 | 8/2012 | Ju |

FOREIGN PATENT DOCUMENTS

| | | |
|---|---|---|
| JP | 52091666 | 8/1977 |
| JP | S59193083 A | 11/1984 |
| JP | S61272987 A | 12/1986 |
| JP | H05114751 A | 5/1993 |
| JP | 2000174350 A | 6/2000 |
| JP | 2000277808 A | 10/2000 |
| JP | 2001077408 A | 3/2001 |
| JP | 2002072021 A | 3/2002 |
| JP | 2006147985 A | 6/2006 |
| JP | 2009176835 A | 8/2009 |
| WO | 96/00918 A1 | 1/1996 |

* cited by examiner

PHOTONIC SEMICONDUCTOR DEVICES IN LLC ASSEMBLY WITH CONTROLLED MOLDING BOUNDARY AND METHOD FOR FORMING SAME

CROSS-REFERENCE TO RELATED APPLICATIONS

This application is a continuation-in-part of U.S. patent application Ser. No. 13/411,275 filed Mar. 2, 2012, and having the title "SEMICONDUCTOR LASER CHIP PACKAGE WITH ENCAPSULATED RECESS MOLDED ON SUBSTRATE AND METHOD FOR FORMING SAME," which is incorporated by reference herein in its entirety. This application claims priority to U.S. Pat. No. 8,431,951, filed Oct. 1, 2009, and having the title "OPTOELECTRONIC DEVICES WITH LAMINATE LEADLESS CARRIER PACKAGING IN SIDE-LOOKER OR TOP-LOOKER DEVICE ORIENTATION," which is incorporated herein by reference in its entirety.

FIELD OF THE INVENTION

The present invention relates to circuit components, and more particularly, is related to a semiconductor laser chip.

BACKGROUND OF THE INVENTION

Surface mount technology (SMT) is used for constructing electronic circuits where the components (surface-mounted components/SMCs) are mounted directly onto the surface of printed circuit boards (PCBs). An electronic device so made is called a surface mount device (SMD). SMT has largely replaced the through-hole technology construction method of fitting components with wire leads into holes in the circuit board.

An SMT component is usually smaller than its through-hole counterpart because it has either smaller leads or no leads at all. It may have short pins or leads of various styles, flat contacts, a matrix of solder balls (BGAs), or terminations on the body of the component.

Edge emitting lasers have beams that widen very fast in a direction normal to the mounting surface. Edge emitting lasers can be mounted in packages with leads that orient the laser perpendicular to the main driver board. The package must have a window cap or encapsulation to protect the laser which is placed at the edge of the lead frame or pedestal of the package base. When mounted on a large, flat surface, such as directly on the main driver board or on a secondary substrate which could be a PCB, ceramic or other substrate that is then mounted on the main driver board, at least a portion of the beam may intersect the surface. To overcome this limitation, edge emitting lasers are often mounted at the edge of a driver board or secondary substrate, where the edge of the laser is adjacent to or nearly adjacent to the edge of the board or substrate so the beam widens in an area beyond the board or substrate. Such an arrangement has several disadvantages. For example, the facet of a laser is typically sensitive to contamination and humidity, among other sensitivities, and the proximity to the edge of the board or substrate may increase the vulnerability of the facet. In addition, the necessity of locating the laser at the edge of a board or substrate limits the flexibility of board design, and may make certain packaging options impractical, for example, certain chip carriers, such as a laminate leadless carrier (LLC). A laminate leadless carrier uses flat metal pads that make contact with a printed circuit board. There are no pins extending out of the package and it may be mounted on the printed circuit board directly. A laminate leadless carrier includes multiple layers of conductive and dielectric layers laminated together.

While SMT provides advantages in manufacturing and circuit layout, the limitations of semiconductor edge emitting laser chips have provided a challenge to SMT lasers. Besides the logistical problems related to positioning a semiconductor laser chip at the edge of a surface mount package, thermal dissipation considerations may conflict with surface mount features. In particular, SMT generally makes it difficult to conduct heat generated by a semiconductor laser chip to the surface of the package, where it may be further dissipated, for example using heat sinks or convection methods.

Photonic semiconductor devices are electrical-to-optical or optical-to-electrical transducers that convert electron signals to photon signals, and photon signals to electron signals. Some photonic semiconductor devices are light emitters such as lasers and light-emitting diodes (LEDs), while others are light detectors such as PN photodiodes, phototransistors, PIN photodiodes, avalanche photodiodes (APDs), single-photon avalanche diodes (SPADs), Silicon photomultiplier (SiPMs), and charge-coupled devices (CCDs). Typical applications for photonic semiconductor devices include telecommunications, range-finders, medical imaging, scientific instruments, and astrophysics applications.

The integration and packaging of photonic semiconductor devices shares many common challenges with its counterparts in integrated circuits (IC) and micro-electromechanical systems (MEMS) such as electrical, thermal and stress issues. There are specific characteristics and challenges related to photonic semiconductor devices.

From structural design perspective, most photonic semiconductor devices have large active area with feature dimension up to a few centimeters, and a functional layer depth that can be as thick as the chip or wafer which is up to a few hundred microns. The contacts are at both front and back sides in most cases. For PIN, APD, SPAD and SiPM devices, the supply voltage may be as high as a few hundred volts. In general, photonic semiconductor devices need optical coupling and/or blocking capabilities, such as antireflection coating (ARC), and filtering. In addition, the assembling of photonic semiconductor devices generally requires precise mechanical dimensions and alignment.

From fabrication process perspective, the assembling lines for photonic devices run at relatively low throughput, and ten thousand parts per year is considered as volume production. Typical production orders range from a few devices to a few thousands of them. The wafer processing lines run two to six inch wafers that are much smaller in size compared to six to twelve inch wafers in IC industry. Heterogeneous semiconductors such as Silicon and III-V are often integrated in the same product.

Photonic semiconductor devices are considered as a specialty item in semiconductor industry when compared with ICs. However photonic semiconductors also face cost reduction pressure from both commercial and military market segments. Therefore, there is a need in the industry to overcome some or all of the above shortcomings.

SUMMARY OF THE INVENTION

Embodiments of the present invention provide photonic semiconductor devices in LLC assembly with a controlled molding boundary and a method for forming the same. Briefly described, the present invention is directed to a laminate leadless carrier package including a photonic semiconductor chip. The package has a substrate supporting the photonic semiconductor chip. The substrate includes a plurality of conductive and dielectric layers laminated together including a bottom conductive layer, a top conductive layer, and a dielectric layer between the top and bottom conductive layers. The package includes a plurality of conductive slotted vias providing electrical connections between the top conductive layer and the bottom conductive layer, a wire bond pad disposed on the top surface of the substrate, a wire bond coupled to the photonic semiconductor chip and the wire bond pad, and an encapsulation covering the photonic semiconductor chip, the wire bond, and at least a portion of the top surface of the substrate, wherein the encapsulation is a molding compound, and the molding compound is pulled back from at least one of the slotted vias. The laminate leadless carrier package is arranged to be mounted in a side-looker configuration on a printed circuit board, the active area of the photonic semiconductor chip is perpendicular to the printed circuit board, and the slotted vias are arranged to be in electrical contact with the printed circuit board.

A second aspect of the present invention is directed to a laminate leadless carrier package having a photonic semiconductor chip, and a substrate supporting the photonic semiconductor chip. The substrate includes a plurality of conductive and dielectric layers laminated together including a bottom conductive layer, a top conductive layer, and a dielectric layer between the top and bottom conductive layers. The LLC includes a plurality of conductive slotted vias providing electrical connections between the top conductive layer and the bottom conductive layer, a wire bond pad positioned on the top surface of the substrate, and a wire bond coupled to the photonic semiconductor chip and the wire bond pad, an encapsulation covering the photonic semiconductor chip, the wire bond, and at least a portion of the top surface of the substrate, wherein the encapsulation is a molding compound. The molding compound is pulled back from a metal contact configured to mechanically and/or electrically connect the laminate leadless package to a printed circuit board. The laminate leadless carrier package is arranged to be mounted in a side-looker configuration on the printed circuit board, the active area of the photonic semiconductor chip is perpendicular to the printed circuit board, and in a top-looker configuration on a printed circuit board, and the active area of the photonic semiconductor chip is parallel to the printed circuit board.

Briefly described, in architecture, a third aspect of the present invention is directed to a process for manufacturing a plurality of laminate leadless carrier packages. The process includes the steps of preparing a substrate, wherein preparing the substrate includes laminating a top conductive layer, a bottom conductive layer, and a dielectric layer between the top and bottom conductive layers together, and wherein the top conductive layer includes a die attach pad, a wire bond pad, and at least two slotted vias, applying epoxy adhesive to the die attach pad, mounting a photonic semiconductor chip on the die attach pad, wire-bonding the photonic semiconductor chip with the wire bond pad using a wire bond, temporarily filling the slotted vias with temporary fillers, molding a molding compound to form an encapsulation covering the photonic semiconductor chip, the wire bond, and at least a portion of the top surface of the substrate, removing the temporary fillers from the slotted vias, and dicing the substrate into individual laminate leadless carrier packages.

Other systems, methods and features of the present invention will be or become apparent to one having ordinary skill in the art upon examining the following drawings and detailed description. It is intended that all such additional systems, methods, and features be included in this description, be within the scope of the present invention and protected by the accompanying claims.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principals of the invention.

DETAILED DESCRIPTION

Figure 1:
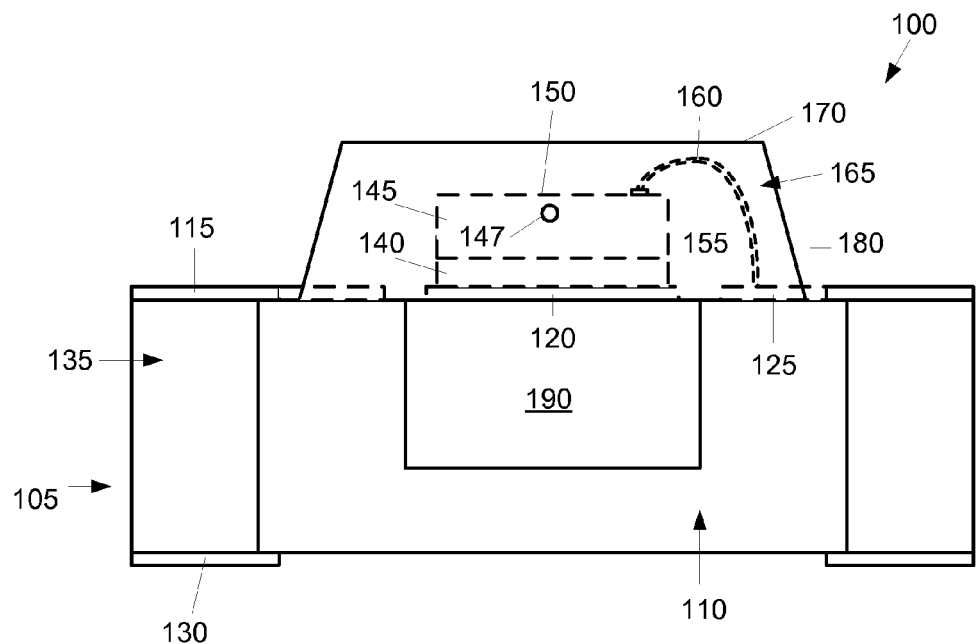
FIG. 1 is a schematic diagram of an exemplary semiconductor laser package in accordance with the present invention.

Reference will now be made in detail to embodiments of the present invention, examples of which are illustrated in the accompanying drawings. Wherever possible, the same reference numbers are used in the drawings and the description to refer to the same or like parts.

Exemplary embodiments for an apparatus and a method for manufacturing a semiconductor optoelectronic package are presented. An optoelectronic chip, for example, a laser chip, is mounted adjacent to a recess region inset from an edge of a substrate. The laser chip is oriented so the laser chip facet overlooks the recess region. A plurality of conductive vias provide electrical connections and/or thermal conduits between a top conductive layer and a bottom conductive layer upon the substrate. An over molding optical epoxy compound encapsulates at least a portion of the top surface of the substrate, the laser chip and the recess region. The semiconductor laser package may be mounted upon a printed circuit board so that the laser beam is parallel to the printed circuit board, or so the laser beam is perpendicular to the printed circuit board.

Other exemplary embodiments may include other types of optoelectronic packages, for example, but not limited to, a light-emitting-diode (LED), a photodiode, a phototransistor, a PIN photodiode, an avalanche photodiode (APD), a charge coupled device (CCD), and a silicon photomultiplier (SiPM).

FIG. 1 illustrates a cross-sectional view of an exemplary embodiment of an optoelectronics package 100 in accordance with the present invention. The optoelectronics package 100 includes a substrate 105, a chip 145, and an encapsulation 165.

The chip 145 may be any laser device, including edge emitting lasers, and the like. For example, the chip 145 may be a laser chip formed of any appropriate material, such as group IV (silicon) semiconductors and group III-V semiconductors. The laser chip 145 may have any structure, such as an epitaxial wafer (EPI) or a reach-through structure.

The optoelectronics package 100 may be an LLC. A leadless carrier uses flat metal pads that make contact with a printed circuit board. There are no pins extending out of the package and it may be mounted directly on the printed circuit board. The laminate chip carrier includes multiple layers of conductive and dielectric layers laminated together. In one example, the laminate leadless carrier includes a top conductive layer and a bottom conductive layer with a dielectric layer between, as described in greater detail below. Depending on the complexity of the design, the laminate chip carrier may have many different conductive and/or dielectric layers.

The optoelectronics package 100 includes the substrate 105 for supporting the chip 145. The substrate 105 may be, but is not limited to, any thin film ceramic substrates, thick film ceramic substrates, and different kinds of printed circuit boards (PCBs). In one preferred embodiment, the optoelectronics package 100 does not include any lead-frame. The substrate 105 may include a dielectric layer 110, a top conductive layer 115 and a bottom conductive layer 130 which are provided above and below the dielectric layer 110 respectively, and a plurality of conductive vias 135 providing electrical connections and/or thermal conduits between the top and bottom conductive layers 115 and 130. The conductive vias 135 may be employed in either the top-looker or the side-looker device orientation (the two orientations will be described in greater detail below). The conductive vias 135 may serve as a conduit for electricity and/or thermal transfer. Such thermal transfer is important to disperse the heat generated by a laser chip that could otherwise prove detrimental to chip performance and reliability.

The top conductive layer 115 includes a die attach pad 120 for attaching chip 145 onto the substrate 105. In particular, a layer of adhesive 140 may be used to attach chip 145 onto the die attach pad 120 above the substrate 105. The top conductive layer 115 also includes a wire bond pad 125 for attaching a wire bond 160, which provides an electrical connection between the chip 145 and the top conductive layer 115. While a single wire bond 160 is used in this embodiment, there is no objection to using two or more wire bonds as appropriate in alternative embodiments. Each conductive via 135 may be a small opening in different slot shapes, such as a small round opening.

Figure 2:
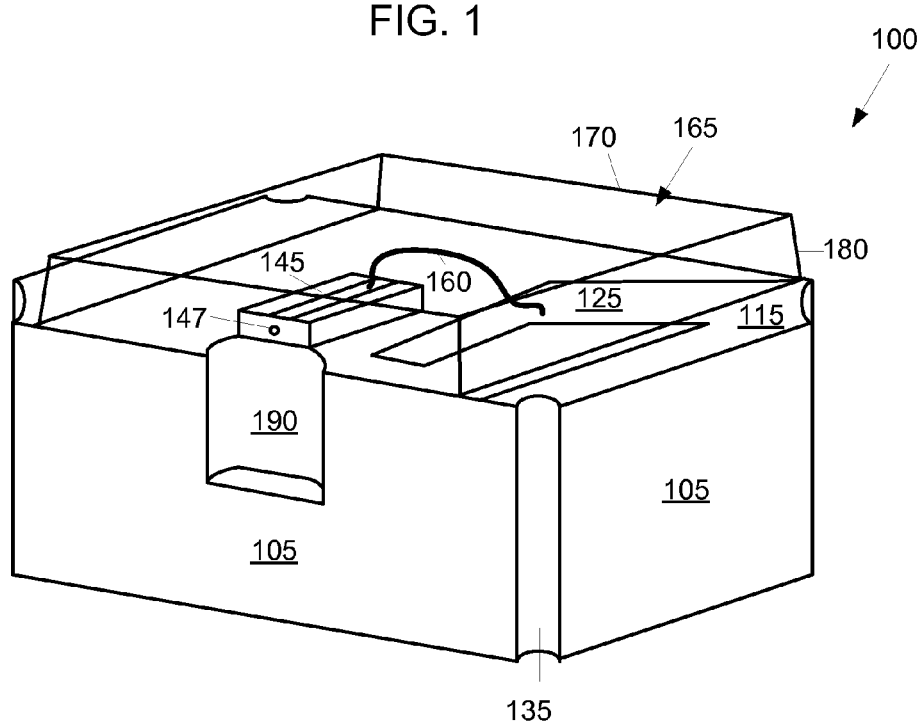
FIG. 2 is a schematic diagram of a perspective view of an exemplary semiconductor laser package.

The substrate 105 has a recess region 190, as shown by FIG. 2, where the substrate material is removed to form a pull-back area at the edge of the substrate 105. The chip 145 is preferably mounted so the laser emitting edge of the chip 145 is adjacent or nearly adjacent to the recess region 190, as shown by FIG. 2. Positioning the chip 145 at the edge of the recess region allows a light beam 310 (FIG. 3) to project outward from the chip 145 without intersecting with the substrate 105. Similarly, the recess region 190 is formed so a full beam of light may be outputted from a laser chip 145 facet without substrate reflections that can distort the light beam profile. The recess region 190 allows for positioning of the laser chip 145 at a location inset from the edge of the package 100 without the light beam 310 (FIG. 3) intersecting the substrate 105.

The encapsulation 165 is provided to encapsulate and protect the chip 145, the wire bond 160, the recess region 190, and the substrate 105 or portions of the substrate 105. In one exemplary embodiment, the encapsulation 165 is used to encapsulate an edge emitting laser chip. Since edge emitting laser chips typically operate at high voltages, the encapsulation 165 may be a molding compound having low ionic content and high moisture resistance. The encapsulation may be, for example, an optical epoxy compound. In some exemplary embodiments, the encapsulation 165 may be a molding compound that provides protection to the chip 145 and the wire bond 160 without putting high stress to the wire bond 160. In some exemplary embodiments, the molding compound may be optically transparent so that it does not filter or attenuate light at particular wavelengths. For example, APTEK 6100-1 A/B may be used as the molding compound. APTEK 6100-1 A/B is a two component, unfilled, water clear, rigid system designed for the encapsulation of LED chips in optoelectronic packages. It provides environmental protection and when casted may serve as the lens portion of the device, displaying excellent clarity and light transmissivity.

The encapsulation 165 is shown in FIG. 1 to cover only a portion of the top surface of the substrate 105, but the encapsulation 165 may cover the entire top surface of the substrate 105 as may be required by the end application. The encapsulation 165 may be retracted or pulled back from one or more conductive vias 135, for example, to ensure solderability of the conductive vias 135 to a printed circuit board. The pullback of the encapsulation 165 from the conductive vias 135 may further prevent contamination to the solderability of conductive vias 135 during the molding process, described further below. The side surface 180 of the encapsulation 165 may be vertical, slanted, or slanted at different angles in different sections of the encapsulation. The top surface 170 (optical interface) of the encapsulation 165 may be molded as a flat surface or as a cylindrical, spherical, aspherical, dome-shaped, torroidal lens, and the like.

An advantage of having the edge of the laser chip 145 within the encapsulation 165 is protection of the active area or facet 147 in the laser chip 145 for example, during assembly or handling of parts after manufacturing and before assembly on a PCB. If the chip 145 is mounted at the edge of a substrate 105 with no recess region 190, the facet 147 of the laser chip 145 would not be protected by the encapsulation 165.

Figure 3:
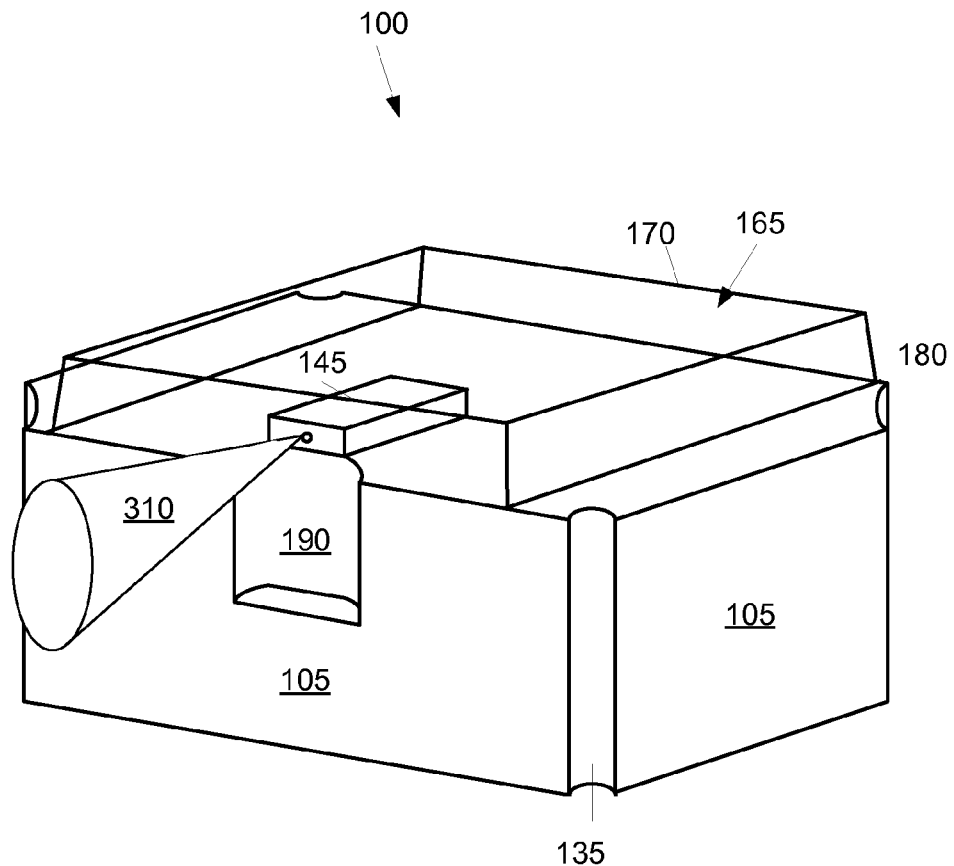
FIG. 3 is a schematic diagram of a perspective view of an exemplary semiconductor laser package indicating the path of the laser beam.

FIG. 3 is a simplified illustration of the optoelectronics package 100 showing the projection of the laser beam 310 from the chip 145 within the semiconductor laser package 100. The beam 310 widens quickly at a divergence angle in the direction it is projected. If the recess 190 was not present, and if the area where the recess 190 is located was instead filled with substrate material, the beam 310 would intersect with the substrate 105. Such an intersection is problematic for several reasons. First, the intersection obstructs the path of the beam 310, absorbing a portion of the energy intended to be transmitted. Second, the substrate 105 would be heated by the energy absorbed from the beam 310. Third, the intersection area could reflect a portion of the beam, causing undesired consequences.

The recess region 190 may be sized so the chip 145 is positioned adjacent or nearly adjacent to the recess region 190. The recess region 190 may have various widths and depths as required by the end application. For example, an application where the beam disperses widely may have a deeper recess area 190 than an application where the beam has a more narrow dispersion. While the recess area 190 in this embodiment is depicted as being rectangular, there is no objection to other shapes for a recess area 190, for example, a semicircle, triangular wedge, or other shapes. The recess region 190 intersects the top surface of the substrate 105, and may not extend to intersect the bottom surface of the substrate 105, as shown in FIG. 3. However, there is no objection to embodiments of the optoelectronics package 100 where the recess region 190 extends to the bottom surface of the substrate 105.

Figure 4:
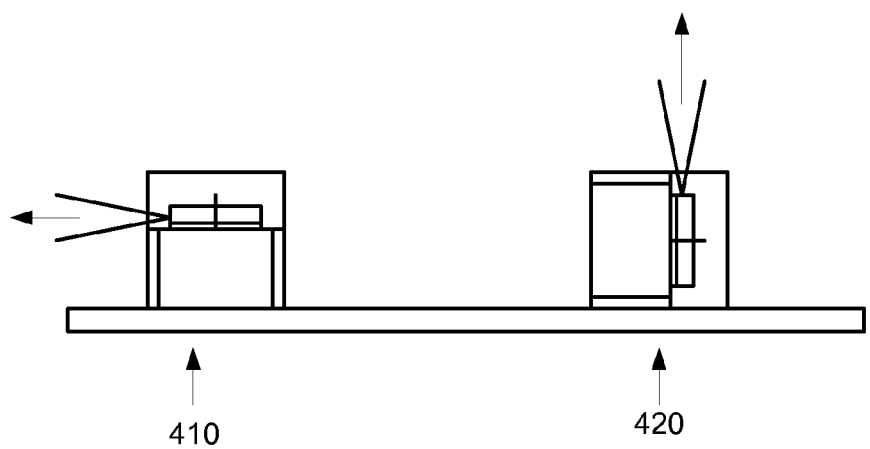
FIG. 4 illustrates an exemplary semiconductor laser package mounted as a side-looker or a top-looker on a printed circuit board.

As shown in FIG. 4, the optoelectronics package 100 may be mounted on a printed circuit board as a side-looker 410 or a top-looker 420. In general, the orientation may be selected based on the direction of light or emitting from the active area of the laser chip relative to the printed circuit board surface. For example, if the emitting from the active area of a laser is perpendicular to the printed circuit board, then a top-looker orientation 420 may be used. In this configuration, the active area of the laser chip is perpendicular to the printed circuit board.

Conversely, if the light is parallel to the printed circuit board, then a side-looker configuration 410 may be used. In this orientation, the active area of the optoelectronic chip is parallel to the printed circuit board. Returning to FIG. 3, the electrical connectivity of the optoelectronics package 100 and the printed circuit board may be through the conducive vias 135, such that the conductive via 135 may be soldered along the running length of the via 135, such as with a side-looker configuration, or at either end of the via 135, such as with a top-looker configuration. The pullback of the encapsulation 165 from one or more vias 135, as described above, may facilitate mounting the optoelectronics package 100 in a side-looker and/or top-looker orientation.

While the exemplary embodiment depicted in FIG. 2 has a single chip 145 and a single recess region 190, there is no objection to alternative embodiments having two or more chips 145. Two or more chips 145 may be aligned to project parallel beams, for example, and share a single recess area 190, or there may be multiple recess regions 190 along a single edge of the substrate 105. Similarly, the optoelectronics package 100 may have recess regions 190 along two or more edges of the substrate 105 to accommodate multiple chips 145 projecting beams 310 oriented in different directions. It should be recognized that in some embodiments, more than one laser chip, wire bond, or die bond pad may be placed in a single semiconductor laser package.

The substrate design considers a variety of thermally conductive materials. In addition, the vias 135 provide thermal conduits to conduct heat generated by the laser chip 145 to the edges of the surface mount package, where it may then be dispersed away from the semiconductor laser packages by methods familiar to persons having ordinary skill in the art. For example, vias 135 made of copper may have thermal conduction properties to reduce the thermal impedance from the laser chip to the final PCA.

It may be advantageous to ensure that the mounting board is maintained below a threshold temperature, for example, 25° C. Maintaining the temperature below the threshold temperature may be aided, for example, by the thermal properties of a conductive adhesive attaching the chip 145 to the substrate 105. The conductive adhesive 140 may be, for example, conductive epoxy or solder.

Figure 5:
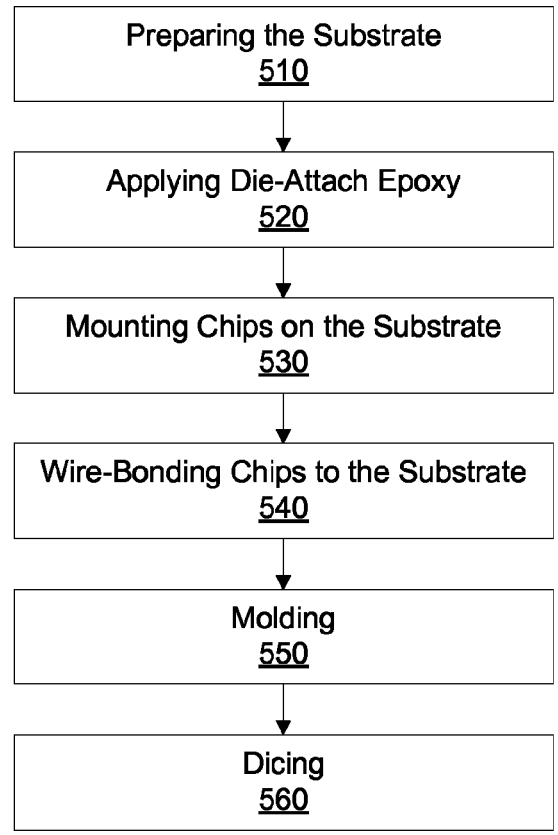
FIG. 5 is a flow chart of an exemplary matrix assembly process for manufacturing the semiconductor laser packages described in the present application.

FIG. 5 is a flow chart of an exemplary embodiment of a matrix assembly process 500 for manufacturing the semiconductor laser packages described in the present application. It should be noted that any process descriptions or blocks in flow charts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention.

The matrix assembly process is designed to meet the market demand for low cost, high volume, miniaturized, and SMT compatible products. As shown by block 510, the substrate is prepared by methods known in the art, including forming the recess regions into the substrate. Recess regions may be formed by etching the substrate, for example, wet or dry etching, by laser ablation, or by other method familiar to persons having ordinary skill in the art. The substrate can be, but is not limited to, a thin film ceramic substrate, a thick film ceramic substrate, and any kind of printed circuit board. The substrate material should have suitable thermal properties, for example, having a thermal resistance range of approximately 10 W/° C./m to 100 W/° C./m. As shown by block 520, die-attach epoxy is applied. The epoxy adhesive may be applied with dispensing, stamping, or printing approaches. It should be noted that other electrically and thermally conductive media, for example, solder, may be substituted for the die-attach epoxy.

As shown by block 530, laser chips mounted on the substrate manually or using a semi-automatic or automatic die-attach machine. As shown by block 540, wire bonds are added to the substrate manually or using a semi-automatic or automatic die-attach machine. Depending on the application, the wire-bond may use different materials, such as Alumina or Gold; different sizes, such as 0.7 mils and 1 mils in diameter; or different configurations such as ball-wedge and wedge-wedge. As shown by block 550, molding compounds are added to the substrate as an encapsulation through molding. The molding compound may be poured as a liquid and then cured. The curing temperature and time depend on the molding materials, and the information can be typically obtained from the material data sheets. The molding compound may be pulled back from some or all slotted vias to prevent contamination to the solderability of conductive vias during the molding process. Prior to adding molding compound to the substrate, the slotted vias may be temporarily filled to further protect the solderability of conductive vias during molding. The temporary fillers may be removed from the slotted vias after molding has been completed, for example, after the molding compound has partially or entirely set. As shown by block 560, the substrate is diced into individual semiconductor laser packages. The dicing may be, for example, done with a saw blade or laser beam.

Figure 6A:
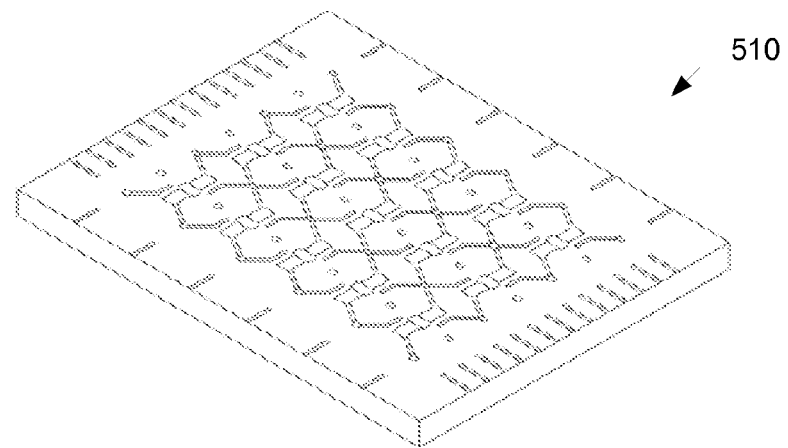
FIG. 6A illustrates a piece of substrate during the preparation stage of the exemplary matrix assembly process of FIG. 5.
Figure 6B:
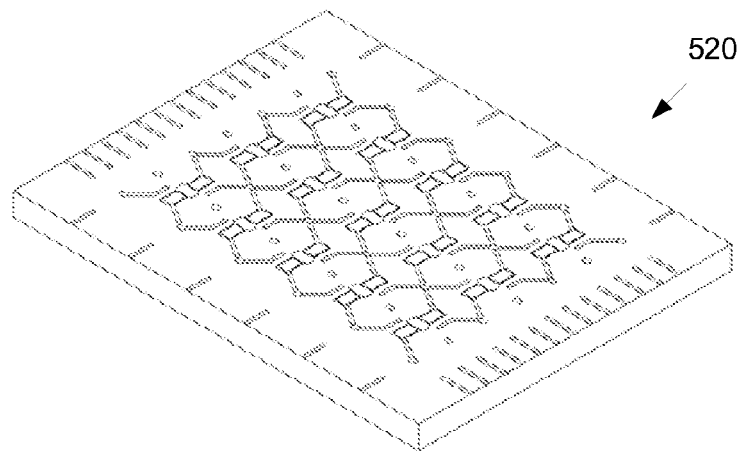
FIG. 6B illustrates a piece of substrate during the epoxy application stage of the exemplary matrix assembly process of FIG. 5.
Figure 6C:
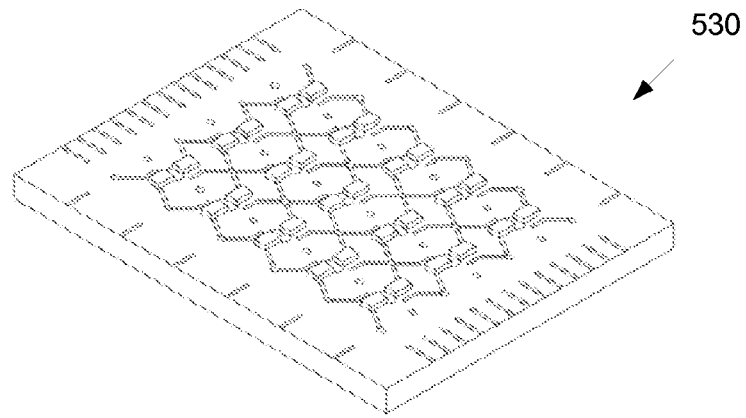
FIG. 6C illustrates a piece of substrate during the chip mounting stage of the exemplary matrix assembly process of FIG. 5.
Figure 6D:
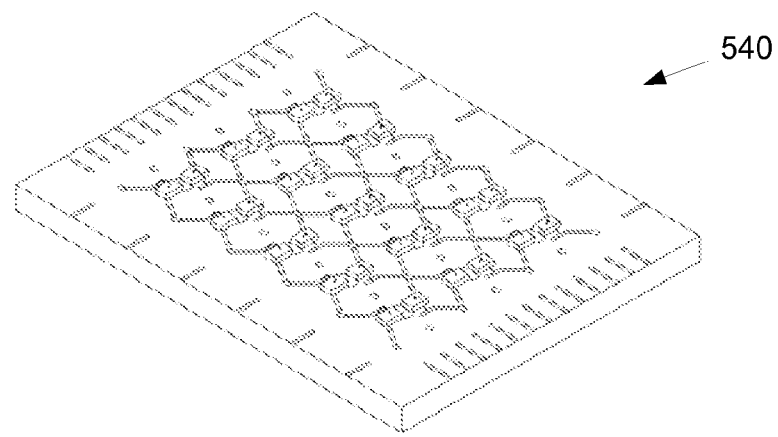
FIG. 6D illustrates a piece of substrate during the wire bonding stage of the exemplary matrix assembly process of FIG. 5.
Figure 6E:
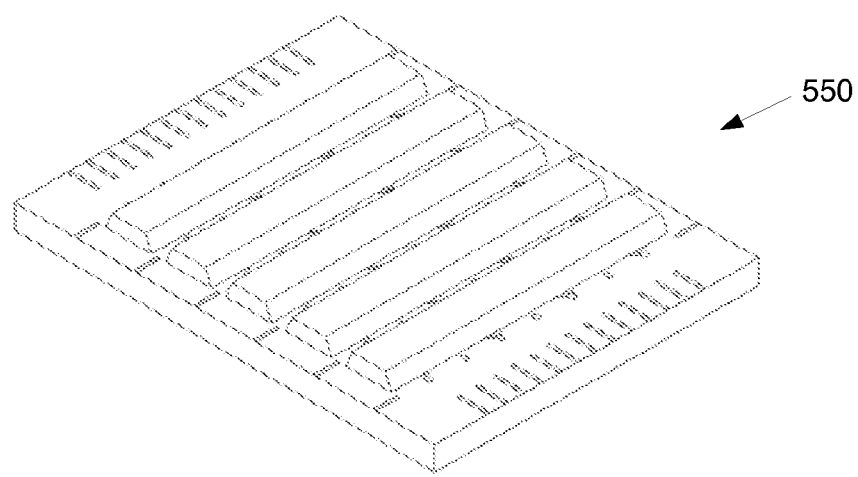
FIG. 6E illustrates a piece of substrate during the molding stage of the exemplary matrix assembly process of FIG. 5.
Figure 6F:
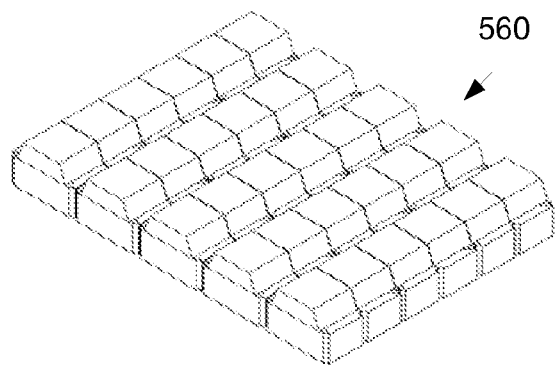
FIG. 6F illustrates a piece of substrate during the dicing stage of the exemplary matrix assembly process of FIG. 5.
Figure 6G:
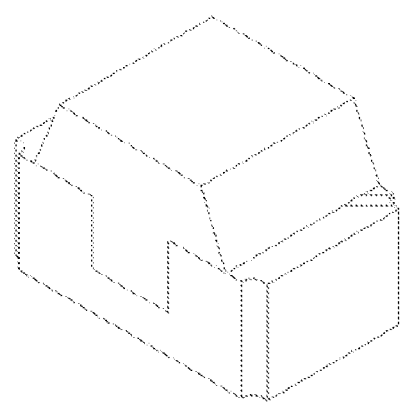
FIG. 6G illustrates an individual optoelectronic package which is the product of the exemplary matrix assembly process of FIG. 5.

FIGS. 6A-6F illustrate a piece of substrate during different stages of the exemplary matrix assembly process 500 described above, and FIG. 6G illustrates an individual semiconductor laser package resulted from the exemplary matrix assembly process. FIG. 6A illustrates a piece of substrate after it is prepared, including forming the recess regions. However, there is no objection to forming the recess regions before or after the rest of the substrate is prepared. FIG. 6B illustrates the assembly after the die-attach epoxy is applied. FIG. 6C illustrates the assembly after laser chips are mounted on the substrate. FIG. 6D illustrates the assembly after wire bonds are added to the substrate. FIG. 6E illustrates the assembly after molding compounds are added to the substrate as an encapsulation. FIG. 6F illustrates the assembly after it is diced into individual semiconductor laser packages. An assembly is the integration of more than one material; it can be one package or an array of packages.

It should be recognized that process 500 can be preceded by any number of processes performed as part of an assembly process. For example, in one preceding process, the substrate may be processed with cavities and/or embosses for the chips to sit on. Also, any number of processes may be performed subsequent to process 500 as part of the assembly process. For example, in one subsequent process, the diced devices may be tested in matrix form or individually.

It should be recognized that the process 500 may include additional steps and/or substeps. For example, polishing of the front face of the encapsulant where the light emerges from the LLC may occur after the dicing has begun, as shown in FIG. 6F, but before the dicing has been completed. For example, the polishing may occur when the front face of multiple recess regions are arranged in rows or strips, so that the encapsulant covering multiple recess regions in one strip may be polished at the same time before final dicing. This may be more efficient than polishing the encapsulant over each recess region individually after final dicing.

Figure 7:
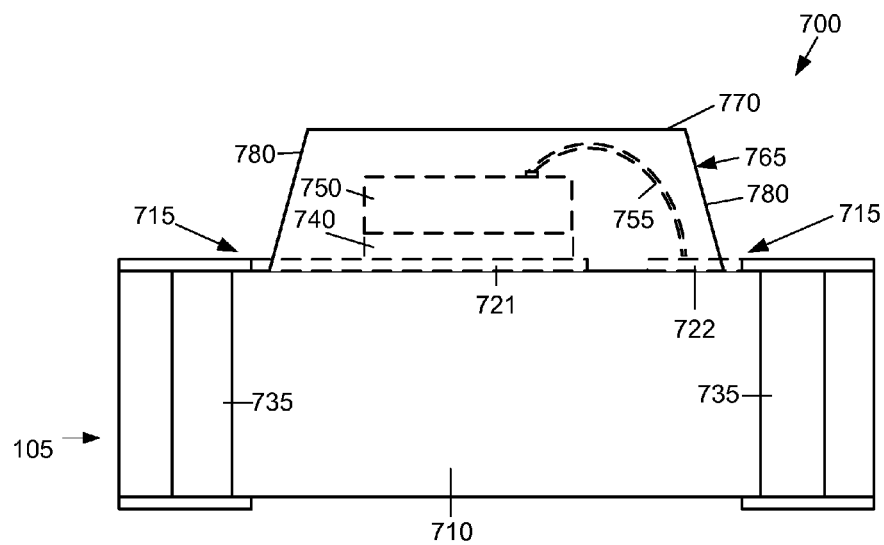
FIG. 7 is a schematic diagram of a cross-sectional view of an exemplary photonic semiconductor device 100 in accordance with the present invention.

FIG. 7 illustrates a cross-sectional view of an exemplary photonic semiconductor device 100 embodiment in accordance with the present invention. The photonic semiconductor device 700 includes a substrate 710, a chip 750, and an encapsulation 780.

The chip 750 may be any photonic semiconductor device, including lasers, light emitting diodes (LEDs), PN photodiodes, phototransistors, PIN photodiodes, avalanche photodiodes (APDs), single-photon avalanche diodes (SPAD), Silicon photomultipliers (SiPMs), charge-coupled devices (CCDs) and the like. For example, the chip 750 may be an APD chip formed of any appropriate material, such as group IV (silicon) semiconductors and group III-V semiconductors (InGaAs). The APD chip may have any structure, such as an epitaxial (EPI) or a reach-through (RT) structure.

The photonic semiconductor device 700 may be an LLC. A leadless carrier uses flat metal pads that make contacts with a printed circuit board. There are no pins extending out of the device and it may be mounted on the printed circuit board directly. A laminate chip carrier has multiple layers of conductive and dielectric layers laminated together. In one example, the laminate leadless carrier includes a top conductive layer and a bottom conductive layer with a dielectric layer between, as described in greater detail below. Depending on the complexity of the design, the LLC may have many different conductive and/or dielectric layers.

The photonic semiconductor device 700 includes a substrate 710 for supporting the chip 750. The substrate 710 may be, but is not limited to, any thin film ceramic substrates, thick film ceramic substrates, and different kinds of printed circuit boards (PCBs). The substrate 710 may include a dielectric layer, a top conductive layer and a bottom conductive layer which are provided above and below the dielectric layer respectively, and a plurality of conductive vias 735 providing electrical connections between the top and bottom conductive layers. The top conductive layer includes a die attach pad 721 for attaching the chip 750 onto the substrate 710. In particular, an adhesive layer 740 may be used to attach the chip 750 onto the die attach pad 121 above the substrate 710. The top conductive layer also includes a wire bond pad 722 for attaching a wire bond 755, which provides an electrical connection between the chip 750 and the top conductive layer. Each conductive via 735 may be a small opening in different slot shapes, such as a small round opening.

The encapsulation 765 is provided to encapsulate the chip 750, the wire bond 755, and the substrate 710 or portions of the substrate. In one exemplary embodiment, the encapsulation 765 is used to encapsulate an APD chip. Since APD chips typically operate at high voltages, the encapsulation 765 may be a molding compound having low ionic contents and high moisture resistance. In some exemplary embodiments, the encapsulation 765 may be a molding compound that provides protection to the chip 750 and the wire bond 755 without putting high stress to the wire bond 755.

In some exemplary embodiments, the molding compound may be optically transparent, such that the molding compound does not filter or attenuate light at particular wavelengths. For example, APTEK 6100-1 A/B may be used as the molding compound. APTEK 6100-1 A/B is a two component, unfilled, water clear, rigid system designed for the encapsulation of LED chips in optoelectronic packages. The molding compound provides environmental protection and when cast may serve as a lens portion of the device, displaying excellent clarity and light transmissivity. In another example, the molding compound may have materials to attenuate, block, or filter light in certain wavelengths. For example, APTEK 6103-A/B may be used as the molding compound. APTEK 6103-A/B is a two component, unfilled, deep red, rigid system designed for the encapsulation of infrared (IR) LED chips in optoelectronic packages. The encapsulation 765 provides environmental protection and when cast may serve as the lens portion of the device, designed to be transparent to IR light while blocking out visible light.

The encapsulation 765 is shown in FIG. 7 to cover only a portion of the top surface of the substrate 710, but in alternative embodiments the encapsulation 765 may cover the entire top surface of the substrate 710 as may be required by the end application. The side surface 520 of the encapsulation 765 may be vertical, slanted, or slanted at different angles in different sections of the encapsulation 765. The top surface 770 (optical interface) of the encapsulation 765 may be molded as a flat surface or as a cylindrical, spherical, aspherical, dome-shaped lens and the like.

The photonic semiconductor device 700 may have controlled molding boundaries 715 pulled back from metal contacts, such as traces and vias that are used to mechanically and/or electrically connect the photonic semiconductor devices to mounting boards in side-looker and/or top-looker orientations. The pull-back is to prevent contamination of molding compound to the integrity of metal contacts, especially when these contacts are soldered to the next-level assembly.

Figure 8:
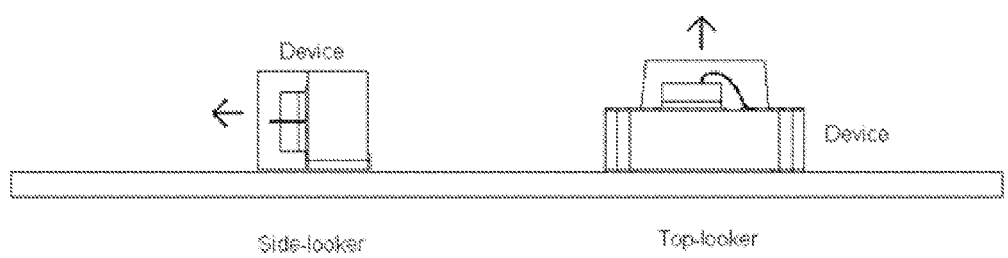
FIG. 8 is a schematic diagram of an exemplary photonic semiconductor device mounted as a side-looker or a top-looker on a printed circuit board.

The photonic device 700 may be configured as a side-looker or a top-looker on a printed circuit board as shown in FIG. 8. In general, the orientation may be selected based on the direction of light striking on or emitting from the active area of the photonic device relative to the printed circuit board surface. For example, if the light striking on a photodiode or the light emitting from an LED is perpendicular to the printed circuit board, then a top-looker configuration may be used. Conversely, if the light is parallel to the printed circuit board, then a side-looker configuration may be used.

Figure 9:
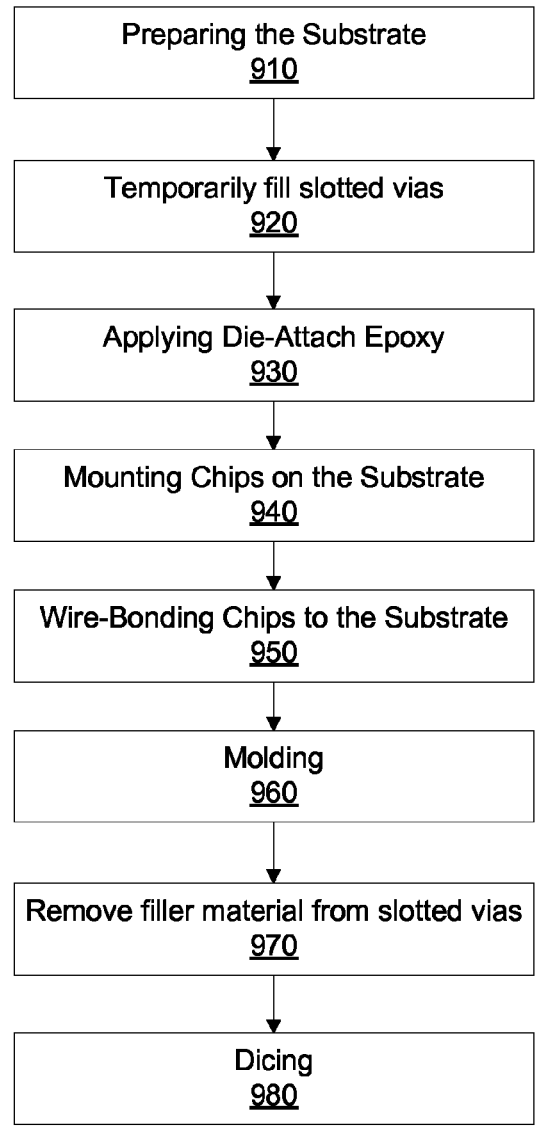
FIG. 9 is a flowchart of an exemplary matrix assembly process for manufacturing the photonic semiconductor device described in the present application.

FIG. 9 shows an embodiment of an exemplary matrix assembly process for manufacturing the photonic devices described in the present application. As discussed earlier, the matrix assembly process is designed to meet the market demand for low cost, high volume, miniaturized, and SMT compatible products. As shown by block 910, the substrate is prepared. The substrate can be, but is not limited to, a thin film ceramic substrate, a thick film ceramic substrate, and any kind of printed circuit board.

As shown by block 920, slotted vias are temporarily filled to prevent the molding compound from flowing to the back side of the substrate during the molding step. The temporary filling the slotted vias also preserves the integrity of slotted vias as metal contacts, especially when these contacts are soldered to the next-level assembly. As shown by block 930, die-attach epoxy is applied. The epoxy adhesive may be applied with dispensing, stamping, or printing approaches. As shown by block 940, chips such as lasers, light emitting diodes (LEDs), PN photodiodes, phototransistors, PIN photodiodes, avalanche photodiodes (APDs), single-photon avalanche diodes (SPAD), Silicon photomultiplier (SiPMs), charge-coupled devices (CCDs) and the like are mounted on the substrate manually or using a semi-automatic or automatic die-attach machine. As shown by block 950, wire bonds are added to the substrate manually or using a semi-automatic or automatic die-attach machine.

Depending on the application, the wire-bond may use different materials, such as Alumina or Gold; different sizes, such as 0.7 mils and 1 mils in diameter; or different configurations such as ball-wedge and wedge-wedge. As shown by block 960, molding compounds are added to the substrate as an encapsulation through molding. As shown by block 970, the temporary filler materials in the slotted vias are removed. As shown by block 980, the assembled and molded substrate is diced into individual photonic devices. The dicing may be done with a saw blade or laser beam.

Figure 10A:
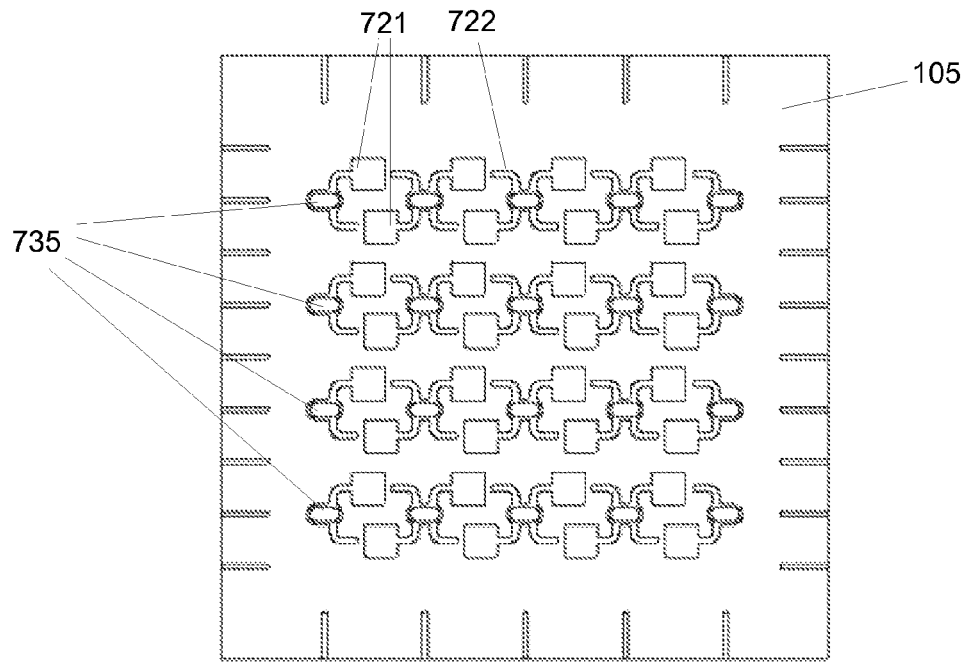
FIG. 10A is a schematic diagram of a piece of substrate during the preparation stage as shown by block 910 of FIG. 9.
Figure 10B:
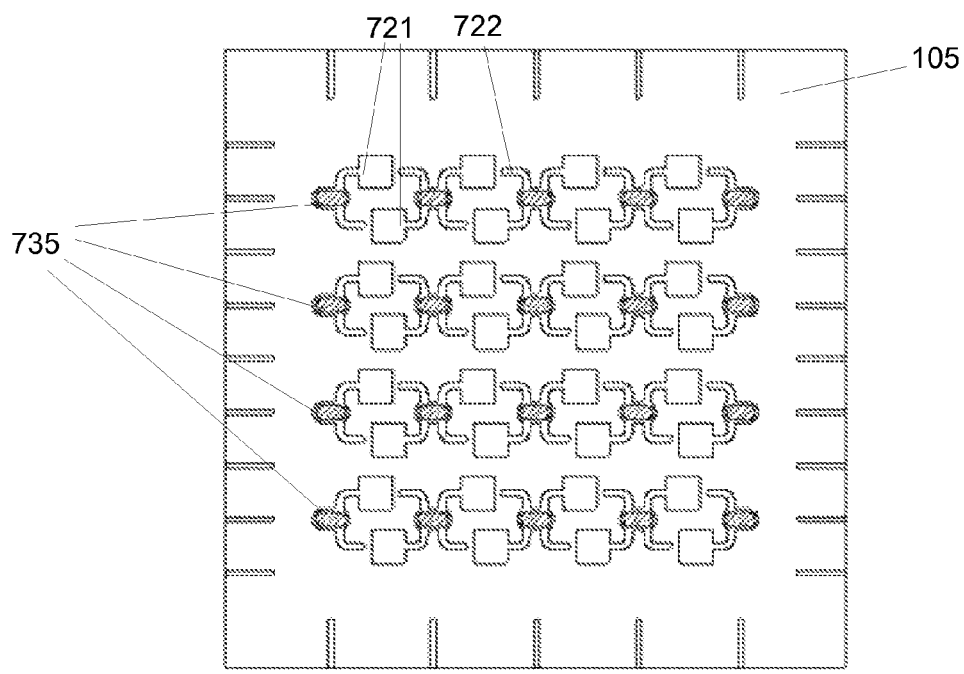
FIG. 10B is a schematic diagram of a piece of substrate during the temporary via filling stage as shown by block 920 of FIG. 9.
Figure 10C:
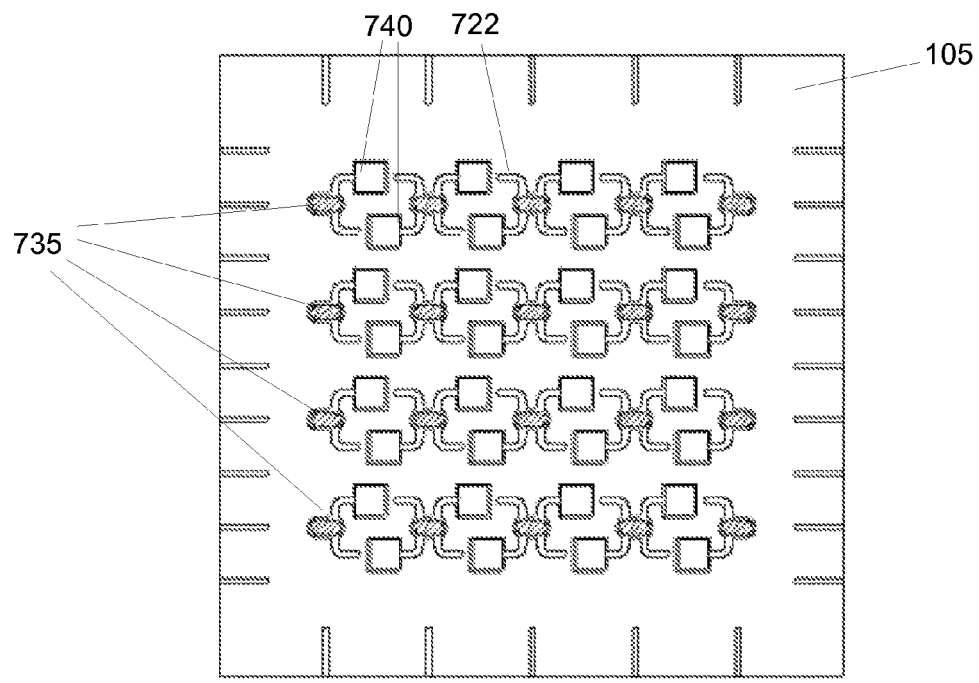
FIG. 10C is a schematic diagram of a piece of substrate during the die attach epoxy application stage as shown by block 930 of FIG. 9.
Figure 10D:
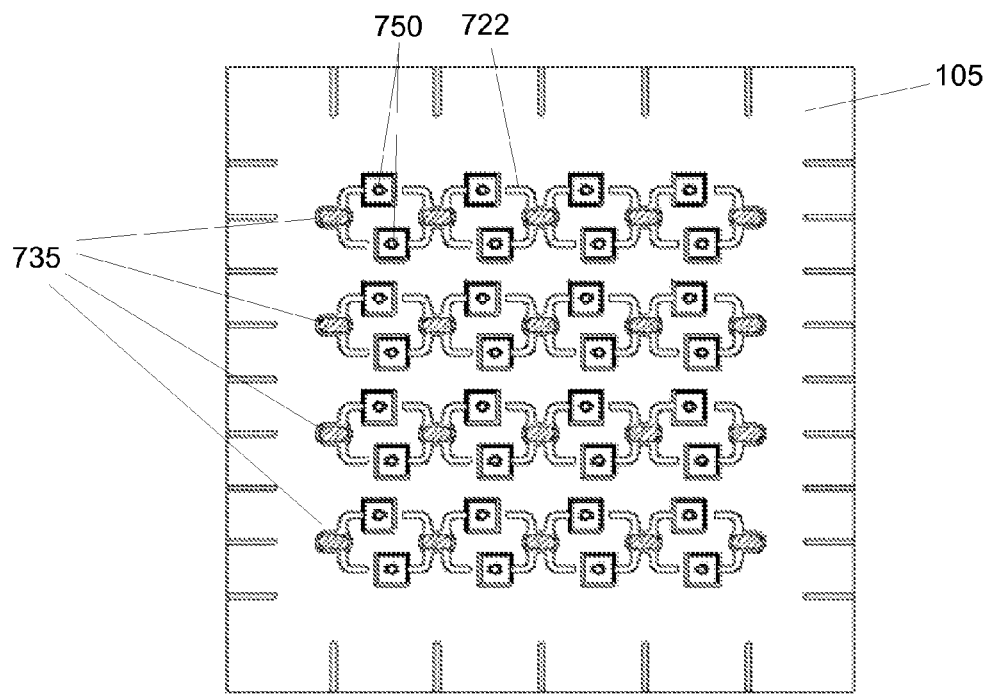
FIG. 10D is a schematic diagram of a piece of substrate during the chip mounting stage as shown by block 940 of FIG. 9.
Figure 10E:
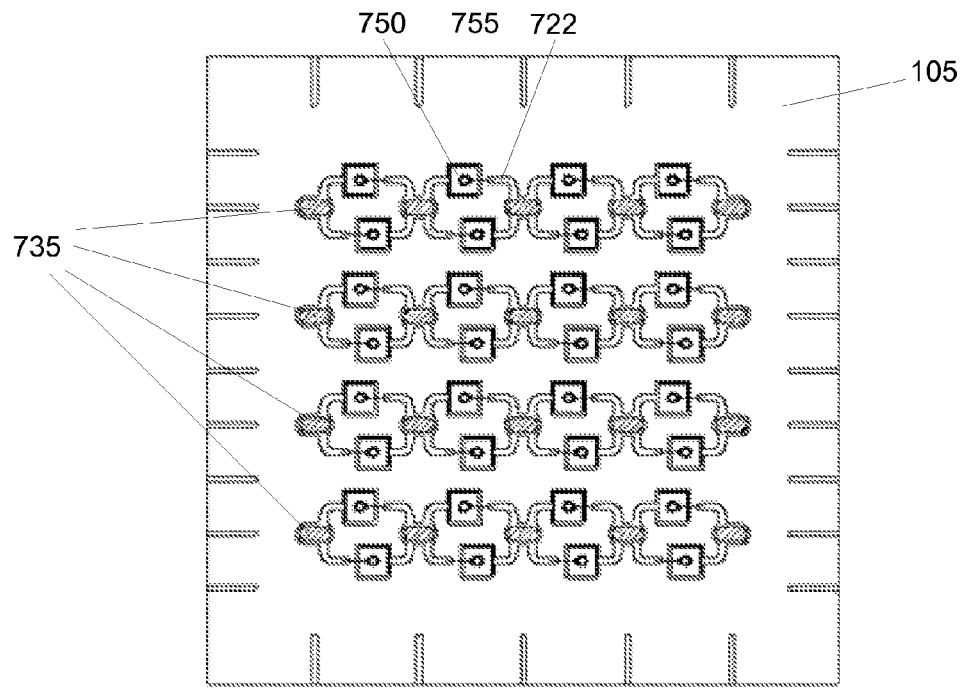
FIG. 10E is a schematic diagram of a piece of substrate during the chip wire-bonding stage as shown by block 950 of FIG. 9.
Figure 10F:
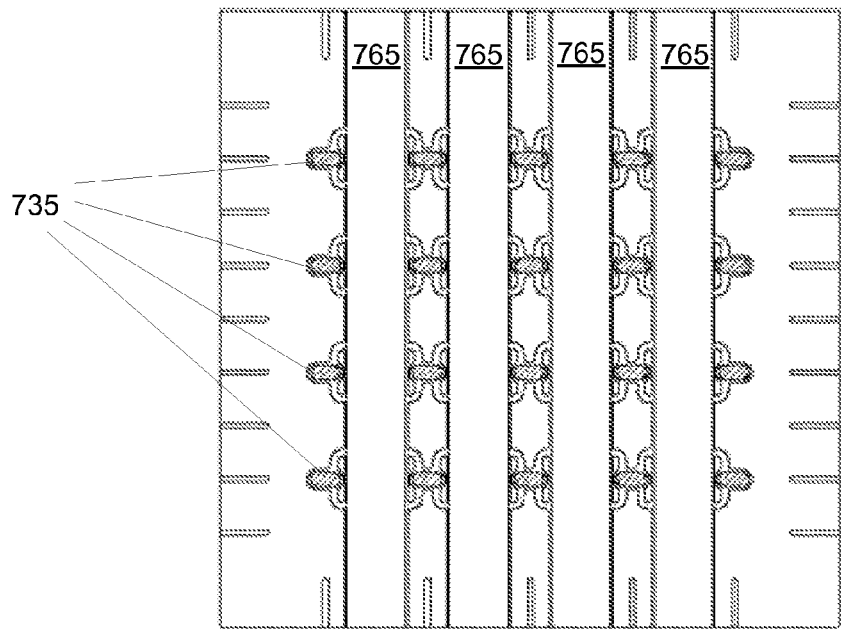
FIG. 10F is a schematic diagram of a piece of substrate during the molding stage as shown by block 960 of FIG. 9.
Figure 10G:
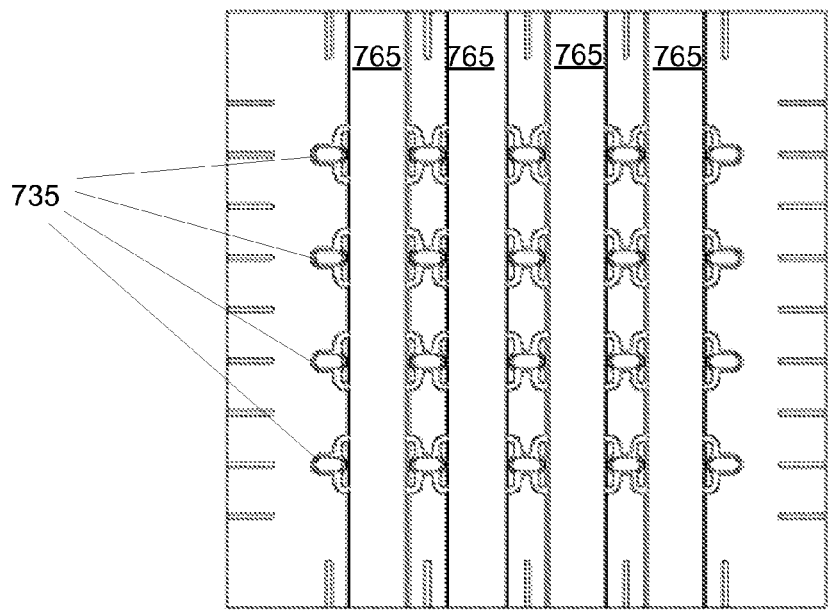
FIG. 10G is a schematic diagram of a piece of substrate during the temporary filler removal stage as shown by block 970 of FIG. 9.
Figure 10H:
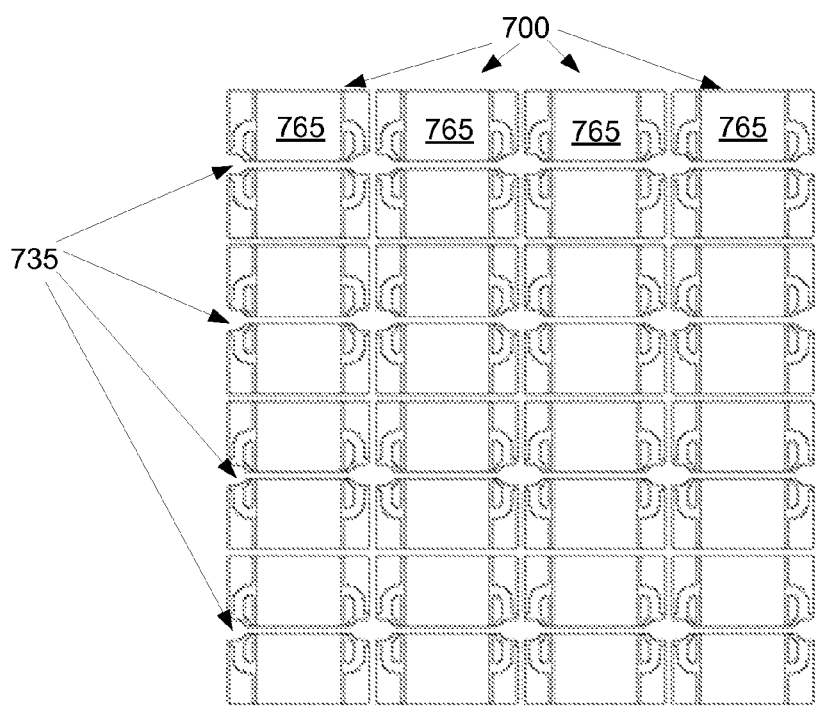
FIG. 10H is a schematic diagram of a piece of substrate during the dicing stage as shown by block 980 of FIG. 9.

FIGS. 10A-10H illustrate an exemplary piece of substrate 105 during different stages of the exemplary matrix assembly process described above. FIG. 10A illustrates the piece of substrate 105 after it is prepared, as shown by block 910. The vias 735 are shown in white to indicate the vias 735 are unfilled at this stage. FIG. 10B illustrates the piece of substrate 105 after the slotted vias 735 are temporarily filled. The vias 735 are shown shaded to indicate the vias 735 are filled with temporary fillers at this stage, as shown by block 920. FIG. 10C illustrates the assembly after the die-attach epoxy 740 is applied, as shown by block 930. FIG. 10D illustrates the assembly after chips 750 such as lasers, light emitting diodes (LEDs), PN photodiodes, phototransistors, PIN photodiodes, avalanche photodiodes (APDs), single-photon avalanche diodes (SPAD), Silicon photomultiplier (SiPMs), charge-coupled devices (CCDs) and the like are mounted on the substrate 105, as shown by block 940. FIG. 10E illustrates the assembly after wire bonds 755 are added to the substrate 105, as shown by block 950. FIG. 10F illustrates the assembly after molding compounds 765 are added to the substrate 105 as an encapsulation, as shown by block 960. FIG. 10G illustrates the assembly after the temporary filler materials in the slotted vias 735 are removed, as shown by block 970. FIG. 10H illustrates the assembly after it is diced into individual photonic devices 700, as shown by block 980.

Figure 11A:
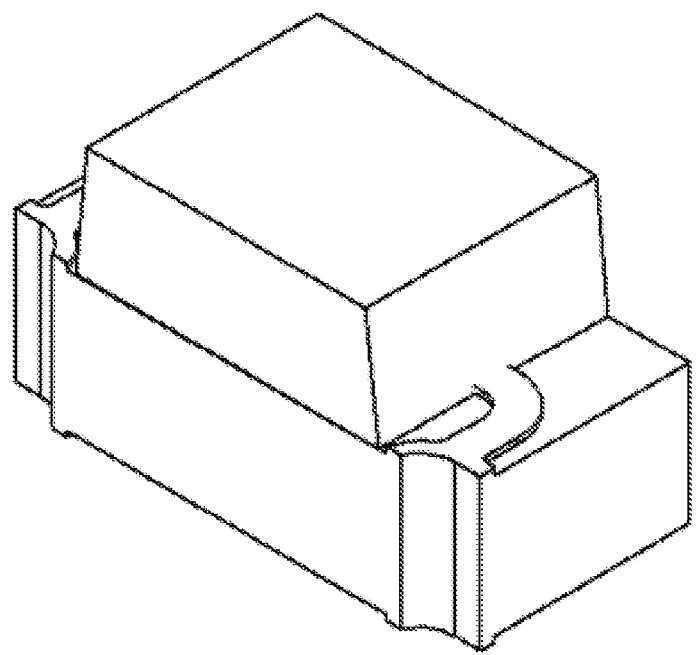
FIG. 11A illustrates an individual photonic semiconductor device in an isotropic view resulting from the exemplary matrix assembling process of FIG. 9.
Figure 11B:
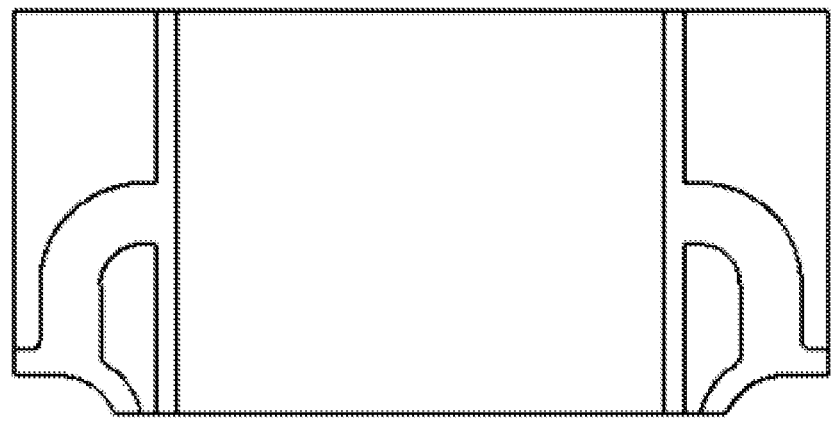
FIG. 11B illustrates an individual photonic semiconductor device in a top view resulting from the exemplary matrix assembling process of FIG. 9.

FIGS. 11A and 11B illustrate the isometric and top views respectively of an individual photonic device resulted from the exemplary matrix assembly process.

It should be recognized that matrix process can be preceded by any number of processes performed as part of an assembly process. For example, in one preceding process, the substrate may be processed with cavities and/or embosses for the chips to sit on. Also, any number of processes may be performed subsequent to the matrix process as part of the assembly process. For example, in one subsequent process, the diced devices may be tested in matrix form or individually.

Although the present invention has been described in connection with some embodiments, it is not intended to be limited to the specific form set forth herein. Rather, the scope of the present invention is limited only by the claims. Additionally, although a feature may appear to be described in connection with particular embodiments, one skilled in the art would recognize that various features of the described embodiments may be combined in accordance with the invention.

Furthermore, although individually listed, a plurality of means, elements or process steps may be implemented by, for example, a single unit or array. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather the feature may be equally applicable to other claim categories, as appropriate.

In summary, exemplary embodiments for an apparatus and a method of manufacturing a semiconductor laser package have been presented. An LLC SMD semiconductor laser provides a smaller footprint, better mechanical alignment of the optical components, lower cost through component array assembly process, and flexibility in orientation of the laser optical axis. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A process for manufacturing a plurality of laminate leadless carrier packages, comprising the steps of:

preparing a substrate, wherein preparing said substrate comprises laminating a top conductive layer, a bottom conductive layer, and a dielectric layer between said top and bottom conductive layers together, and wherein said top conductive layer comprises a die attach pad, a wire bond pad, and at least two slotted vias;

applying epoxy adhesive to said die attach pad;

mounting a photonic semiconductor chip on said die attach pad;

wire-bonding said photonic semiconductor chip with said wire bond pad using a wire bond;

temporarily filling said slotted vias with temporary fillers;

molding a molding compound to form an encapsulation covering said photonic semiconductor chip, said wire bond, and at least a portion of said top surface of said substrate;

removing said temporary fillers from the slotted vias; and dicing said substrate into individual laminate leadless carrier packages.

2. The process of claim 1, wherein said at least two slotted vias comprise a conductive via providing electrical connection between said top conductive layer and said bottom conductive layer.

3. The process of claim 1, wherein said at least two slotted vias comprise a slotted via on said top conductive layer.

4. The process of claim 3, further comprising the step of wherein said at least two slotted vias comprise a slotted via on said top conductive layer for soldering said top conductive layer to mounting pads on a printed circuit board.

5. The process of claim 4, wherein an active area of said photonic semiconductor chip is arranged perpendicular to said printed circuit board.

6. The process of claim 4, wherein an active area of said photonic semiconductor chip is arranged parallel to said printed circuit board.

7. The process of claim 1, further comprising the step of forming a boundary on said top conductive layer between said encapsulation covering and a metal contact.

8. The process of claim 7, wherein said metal contact comprises a trace on said top conductive layer configured to mechanically and/or electrically connect the photonic semiconductor devices to a mounting board in a side-looker and/or a top-looker orientation.

9. The process of claim 7, wherein said metal contact comprises at least one of said slotted vias.

10. The process of claim 7, wherein said boundary is configured to prevent contamination of said molding compound to the integrity of said metal contact.

11. The process of claim 1, wherein said wire bond pad comprises a portion of said top conductive layer.

12. The process of claim 1, wherein said molding compound is optically transparent to a band of wavelengths and filters light at particular wavelengths.

13. The process of claim 1, further comprising the step of molding said top surface of said encapsulation as a flat surface.

14. The process of claim 1, further comprising the step of molding said top surface of said encapsulation as a lens.

15. The process of claim 14, wherein said lens selected from a group consisting of a cylindrical lens, a spherical lens, a torroidal lens, an aspherical lens, and a dome-shaped lens.

16. The process of claim 1, further comprising the step of molding a footing from said encapsulation configured to stabilize said packages when mounted as side-lookers.

17. The process of claim 1, wherein said photonic semiconductor chip is selected from said group consisting of a laser, a light-emitting-diode, a PN photodiode, a phototransistor, a PIN photodiode, an avalanche photodiode, a single-photon avalanche diode, a charge coupled device, and a silicon photomultiplier.

18. The process of claim 1, wherein said substrate is selected from said group consisting of thin film ceramic substrates, thick film ceramic substrates, and printed circuit boards.

19. The process of claim 1, further comprising the step of positioning an optical filter above an active area of said photonic semiconductor chip.

20. The process of claim 1, wherein said molding further comprises encapsulating said optical filter.

21. A process for manufacturing a laminate leadless carrier package, comprising the steps of:

preparing a substrate, wherein preparing said substrate comprises laminating a top conductive layer, a bottom conductive layer, and a dielectric layer between said top and bottom conductive layers together, and wherein said top conductive layer comprises a die attach pad, a wire bond pad, and at least two slotted vias;

applying epoxy adhesive to said die attach pad;

mounting a photonic semiconductor chip on said die attach pad;

wire-bonding said photonic semiconductor chip with said wire bond pad using a wire bond;

temporarily filling said slotted vias with temporary fillers;

molding a molding compound to form an encapsulation covering said photonic semiconductor chip, said wire bond, and at least a portion of said top surface of said substrate; and removing said temporary fillers from said slotted vias.

* * * * *